US010535802B2

(12) United States Patent
Choi et al.

(10) Patent No.: US 10,535,802 B2
(45) Date of Patent: Jan. 14, 2020

(54) LIGHT EMITTING DEVICE LIGHT-AMPLIFIED WITH GRAPHENE AND METHOD FOR MANUFACTURING SAME

(71) Applicant: UNIVERSITY-INDUSTRY COOPERATION GROUP OF KYUNG HEE UNIVERSITY, Gyeonggi-do, Yongin-si (KR)

(72) Inventors: Suk Ho Choi, Suwon-si (KR); Chang Oh Kim, Seoul (KR); Sung Kim, Suwon-si (KR)

(73) Assignee: UNIVERSITY-INDUSTRY COOPERATION GROUP OF KYUNG HEE UNIVERSITY (KR)

( * ) Notice: Subject to any disclaimer, the term of this patent is extended or adjusted under 35 U.S.C. 154(b) by 47 days.

(21) Appl. No.: 15/843,392

(22) Filed: Dec. 15, 2017

(65) Prior Publication Data

US 2018/0114881 A1 Apr. 26, 2018

Related U.S. Application Data

(63) Continuation of application No. 14/779,448, filed as application No. PCT/KR2013/005490 on Jun. 21, 2013, now abandoned.

(30) Foreign Application Priority Data

Mar. 29, 2013 (KR) .................. 10-2013-0034581

(51) Int. Cl.
*H01L 33/40* (2010.01)
*H01L 33/42* (2010.01)
(Continued)

(52) U.S. Cl.
CPC .............. *H01L 33/40* (2013.01); *H01L 33/38* (2013.01); *H01L 33/42* (2013.01); *H01L 33/20* (2013.01); *H01L 2933/0016* (2013.01)

(58) Field of Classification Search
CPC . H01L 33/38; H01L 33/42; H01L 2933/0016; H01L 33/20
(Continued)

(56) References Cited

U.S. PATENT DOCUMENTS 7,988,941 B2 8/2011 Choi et al.
8,618,729 B2 12/2013 Frischeisen et al.
(Continued)

FOREIGN PATENT DOCUMENTS

EP 2980863 2/2016
JP 2008226868 9/2008
(Continued)

OTHER PUBLICATIONS

Lv et al, Nitrogen-doped graphene: beyond single substitution and enhanced molecular sensing, Aug. 17, 2012, Scientific Reports, 2:586, pp. 1-7.*
(Continued)

*Primary Examiner* — David Chen
(74) *Attorney, Agent, or Firm* — Onello & Mello, LLP

(57) ABSTRACT

The purpose of the present invention is to provide a method for manufacturing a light-amplified optoelectronic device, on which pristine or doped graphene is transferred. Specifically, the method includes the steps of: depositing a first electrode, as a thin film, on the light emitting device; transferring pristine or doped graphene on the electrode thin film; etching the light emitting device in contact with the electrode thin film on which the transferred graphene has been transferred, thereby removing a part of the electrode thereon; spin-coating photoresist on the etched light emitting device; removing the photoresist from the spin-coated light emitting device, thereby forming an electrode thin film in a
(Continued)

spin form and the pristine transferred to or graphene doped to the electrode thin film; and depositing metal on a second electrode.

6 Claims, 17 Drawing Sheets

(51) Int. Cl.
*H01L 33/38* (2010.01)
*H01L 33/20* (2010.01)

(58) Field of Classification Search
USPC .................. 438/22, 29, 46, 47; 257/79, 99
See application file for complete search history.

(56) References Cited

U.S. PATENT DOCUMENTS

| | | | | |
|---|---|---|---|---|
| 2008/0142810 | A1* | 6/2008 | Tompa | B82Y 20/00 257/76 |
| 2009/0079040 | A1 | 3/2009 | Schultz et al. | |
| 2010/0038674 | A1* | 2/2010 | Chen | H01L 33/145 257/102 |
| 2011/0097832 | A1* | 4/2011 | Fan | H01L 33/22 438/29 |
| 2011/0127471 | A1 | 6/2011 | Shin et al. | |
| 2011/0244210 | A1 | 10/2011 | Choi et al. | |
| 2012/0068152 | A1* | 3/2012 | Hwang | H01L 29/78684 257/9 |
| 2012/0068154 | A1* | 3/2012 | Hwang | H01L 51/502 257/13 |
| 2012/0104432 | A1 | 5/2012 | Shim et al. | |
| 2012/0141799 | A1* | 6/2012 | Kub | B82Y 30/00 428/408 |
| 2012/0161192 | A1* | 6/2012 | Kim | H01B 1/04 257/99 |
| 2012/0286234 | A1 | 11/2012 | Yager | |
| 2013/0099255 | A1 | 4/2013 | Lee et al. | |
| 2013/0193404 | A1* | 8/2013 | Koppens | H01L 31/02327 257/9 |
| 2013/0256702 | A1 | 10/2013 | Liu et al. | |
| 2013/0285012 | A1* | 10/2013 | Lee | H01L 33/04 257/13 |
| 2015/0069350 | A1 | 3/2015 | Kim et al. | |

FOREIGN PATENT DOCUMENTS

| | | |
|---|---|---|
| KR | 20090043418 | 5/2009 |
| KR | 20110068838 | 6/2011 |
| KR | 20120029339 | 3/2012 |
| KR | 20120034681 | 4/2012 |
| KR | 20120044545 | 5/2012 |
| KR | 20120067159 | 6/2012 |
| KR | 101181281 | 9/2012 |
| KR | 20130030840 | 3/2013 |

OTHER PUBLICATIONS

Extended European Search Report dated Sep. 28, 2016 issued in corresponding European patent application No. 13879836.8-1551.
NOA dated Sep. 5, 2015 issued in corresponding Korean application 1020130034581.
Hee Shin Dong et al.: "Annealing effects on the characteristics of AuCl3-doped graphene", Journal of Applied Physics, American Institute of Physics, US, vol. 113, No. 6, Feb. 14, 2013, pp. 64305-64305, ISSN: 0021-8979, DOI: 10.1063/1.4790888.
International Search Report dated Jan. 13, 2014 issued in corresponding International application No. PCT/KR2013/005490.
Ki Kang Kim et al: "Enhancing the conductivity of transparent graphene films via doping," Nanotechnology, IOP, Bristol, GB, vol. 21, No. 28, Jun. 28, 2010, p. 285205, ISSN: 0957-4484, DOI: 10.1088/0957-4484/21/28/285205.
Ruitao Lv et al: "Towards new graphene materials: Doped graphene sheets and nanoribbons", Materials Letters, North Holland Publishing Company. Amsterdam, NL, vol. 78, Apr. 5, 2012, pp. 209-218, ISSN: 0167-577X, DOI: 10.1016/J.MATLET.2012.04.033.
Wang et al., Review on Recent Progress in Nitrogen-Doped Graphene: Synthesis, Characterization, and Its Potential Applications, Mar. 16, 2012, American Chemical Society, ACS Catal., 2012, 2 (5), pp. 781-794.
Korean Office Action dated May 31, 2018 issued in corresponding Korean Application No. 10-2014-0115491.

* cited by examiner

LIGHT EMITTING DEVICE LIGHT-AMPLIFIED WITH GRAPHENE AND METHOD FOR MANUFACTURING SAME

CROSS REFERENCE TO RELATED APPLICATIONS

The present application is a continuation application of U.S. patent application Ser. No. 14/779,448, filed Sep. 23, 2015, which is a 371 national stage application of Patent Cooperation Treaty Application No. PCT/KR2013/005490 filed Jun. 21, 2013, entitled LIGHT EMITTING DEVICE LIGHT-AMPLIFIED WITH GRAPHENE AND METHOD FOR MANUFACTURING SAME, which in turn claims priority under 35 USC 119(b) from Korean Patent Application No. 10-2013-0034581 filed Mar. 29, 2013, the disclosures of which are incorporated herein by reference in their entireties.

BACKGROUND

1. Field of the Invention

The present invention relates to a light emitting device including a graphene layer on an electrode and a method for fabricating the same.

2. Description of the Related Art

A light emitting diode device, a solid electronic device converting current into light, includes a p-type semiconductor layer and an n-type semiconductor layer, and an active layer interposed therebetween and formed of a semiconductor material. In the light emitting diode device, when a driving current is applied to both ends of the p-type semiconductor layer and the n-type semiconductor layer, electrons and holes may be injected from the p-type semiconductor layer and the n-type semiconductor layer into the active layer and may be recombined with each other in the active layer to thereby generate light.

Starting with the development of a visible ray light emitting diode (LED) in 1962, a red light emitting diode and a green light emitting diode have been sequentially developed, and in accordance with the development of a blue light emitting diode using gallium nitride (GaN) in 1995, the implementation of full color has been enabled and accordingly, the development of light emitting diodes (LED) has been accelerated. Consequently, light emitting diodes (LED) have been employed in a variety of field and have been used in full-color electronic boards, traffic lights, automobile dashboards and lights, and display backlights.

It has become able to manufacture light emitting diodes, formed of GaN, and implementing three primary colors of light from blue color to red color, and ultraviolet rays, by changing a component ratio of indium or aluminum to gallium, and a great deal of studies have been ongoing to implement light emitting diodes having more high efficiency.

As a method of increasing efficiency of light emitting diodes, surface plasmon effects may be used. Through surface plasmon effects exhibited from a metal surface, the intensity of an electromagnetic field on the metal surface may be amplified. In general, since an expensive noble metal such as gold or silver needs to be used as a surface plasmon metal, limitation such as high costs may be caused.

Graphene, a two-dimensional material configured of a single layer of carbon atoms has been prominent due to several novel, excellent properties since the discovery thereof in 2004. In particular, as the 2010 Nobel Prize in Physics was awarded to the two, Novoselov and Geim, who separated a single atomic layer graphene for the first time, graphene is drawing much attention from the general public as well as researchers around the world.

Graphene is a material having the highest degree of electrical or thermal conductivity while being thinnest among materials that have been known until now and is also a flexible material while having toughness. By utilizing such excellent properties of graphene, it is expected to use graphene as a structural material or to replace an electronic element formed of silicon (Si) with graphene. The practical use of graphene as a novel material has been extended in the field of the next generation displays such as flexible displays, touch panels and the like, the field of energy industries such as solar batteries and the like, and the field of various electronic industries such as smart windows, RFIDs and the like.

SUMMARY

An aspect of the present invention may provide a light-amplified optoelectronic device using pristine graphene or doped graphene transferred on a surface thereof, which is intended to manufacture an optoelectronic device having high efficiency while requiring low power consumption, so as to be applied to an industrial process of lighting, a primary target or goal of a light emitting diode.

Another aspect of the present invention may also provide a method for fabricating the light-amplified optoelectronic device using pristine graphene or doped graphene.

A light emitting device according to an exemplary embodiment comprises an electrode layer contacting an upper portion of a light emitting diode (LED) and a layer formed of pristine or doped graphene on the electrode layer.

In the light emitting device, the electrode layer may be a zinc oxide thin film.

In the light emitting device, the doped graphene may be n-type graphene.

In the light emitting device, the n-type graphene may contain at least one element selected from a group consisting of nitrogen (N), fluorine (F), and manganese (Mn), or contains ammonia, benzyl viologen (BV) or mixtures thereof, in the graphene.

In the light emitting device, a concentration of a compound contained in the n-type graphene may range from 1 to 50 mM.

In the light emitting device, the graphene may be p-type graphene.

In the light emitting device, the p-type graphene may contain at least one element from among oxygen (O), gold (Au), and bismuth (Bi), or at least one compound selected from a group consisting of $CH_3NO_2$, $HNO_3$, $HAuCl_4$, $H_2SO_4$, HCl, and $AuCl_3$, or mixtures thereof, in the graphene.

In the light emitting device, a concentration of the compound contained in the graphene may range from 1 to 50 mM.

A method for fabricating a light emitting device of a graphene/zinc oxide electrode according to another exemplary embodiment, comprises depositing a first electrode as a thin film, on the light emitting device, transferring graphene on the first electrode thin film to dope the graphene into the film, etching the light emitting device in contact with the first electrode thin film on which the graphene is transferred to thereby remove a portion of the first electrode, spin-coating photoresist on the etched light emitting device, removing the photoresist from the spin-coated light emitting device to thereby form a spin-shaped electrode thin film as well as pristine or doped graphene on the electrode film; and depositing a metal on a second electrode.

The method may further comprise exposing a portion of the first electrode thin film by removing a portion of the graphene through a photolithography process, prior to the depositing of the metal on the second electrode.

In the method, the first electrode may be a graphene/zinc oxide electrode thin film, and the metal on the second electrode is gold.

In the method, the graphene may be n-type graphene.

In the method, the n-type graphene may contain at least one element selected from a group consisting of nitrogen (N), fluorine (F), and manganese (Mn), or contains ammonia, benzyl viologen (BV) or mixtures thereof, in the graphene.

In the method, a concentration of a compound contained in the n-type graphene may range from 1 to 50 mM.

In the method, the graphene may be p-type graphene.

In the method, the p-type graphene may contain at least one element from among oxygen (O), gold (Au), and bismuth (Bi), or at least one compound selected from a group consisting of $CH_3NO_2$, $HNO_3$, $HAuCl_4$, $H_2SO_4$, HCl, and $AuCl_3$, or mixtures thereof, in the graphene.

In the method, a concentration of the compound contained in the graphene may range from 1 to 50 mM.

In the method, the doping of the graphene may be performed through annealing under a nitrogen atmosphere.

In the method, the annealing may be performed at a temperature of 700° C. to 1200° C. for 3 minutes to 10 minutes.

However, aspects of the present invention are not restricted to the one set forth herein. The above and other aspects of the present invention will become more apparent to one of ordinary skill in the art to which the present invention pertains by referencing the detailed description of the present invention given below.

Advantageous Effects

A technology of increasing light emission efficiency by grafting light amplification effects of graphene onto an optoelectronic device such as a GaN-based blue light emitting diode device may be provided, and a variety of applicability thereof may be suggested.

In addition, a high efficiency optoelectronic device may be fabricated with a low cost to establish the foundation directly applicable to the current industry environment.

BRIEF DESCRIPTION OF DRAWINGS

The above and other aspects and features of the present invention will become more apparent by describing in detail exemplary embodiments thereof with reference to the attached drawings, in which.

DETAILED DESCRIPTION

Figure 1:
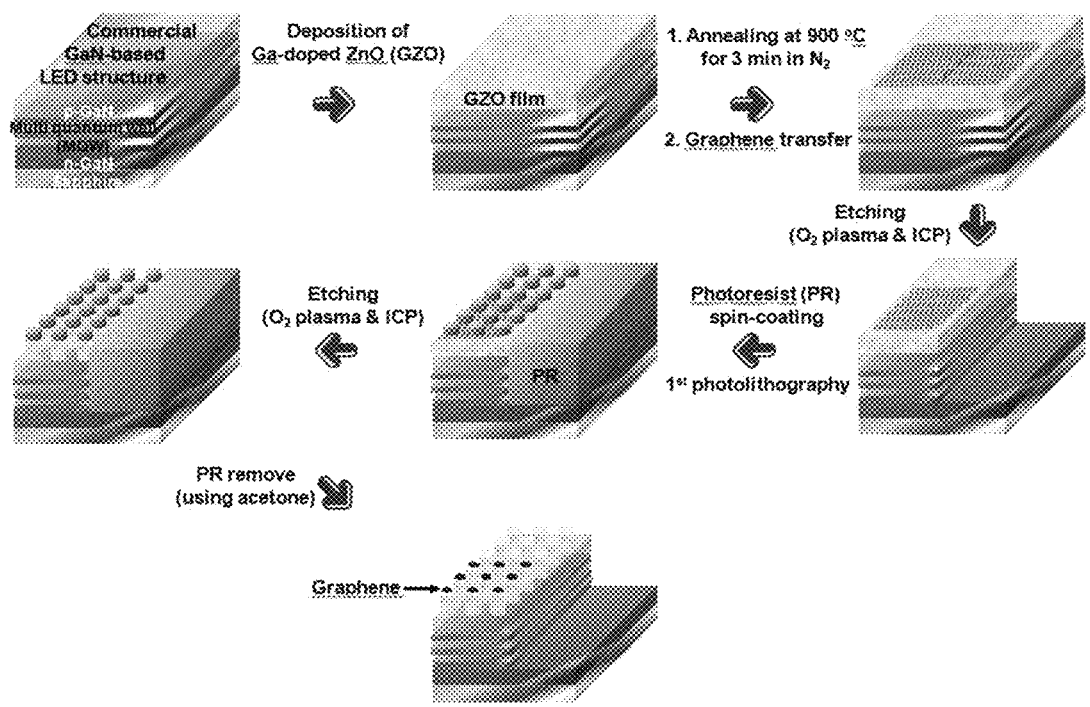
FIG. 1 is a schematic view illustrating a process for fabricating a light emitting device according to an exemplary embodiment of the present invention.
Figure 2:
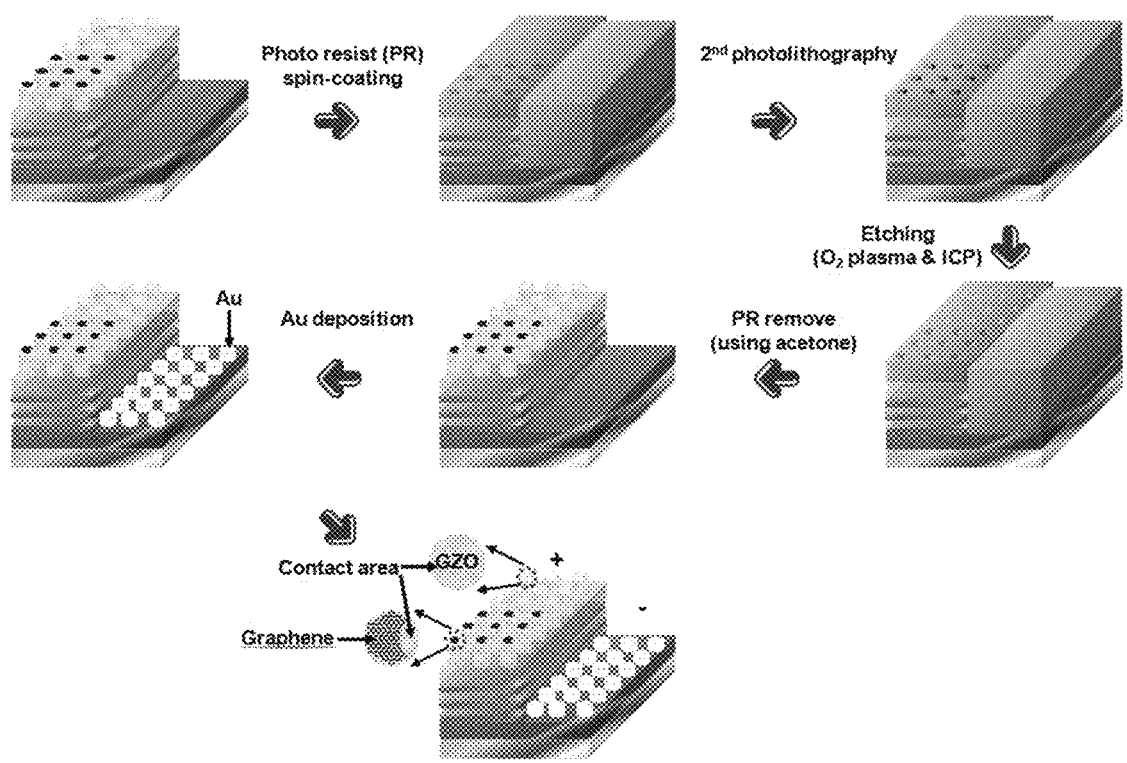
FIG. 2 is a schematic view illustrating a process for fabricating a light emitting device according to another exemplary embodiment of the present invention.
Figure 3:
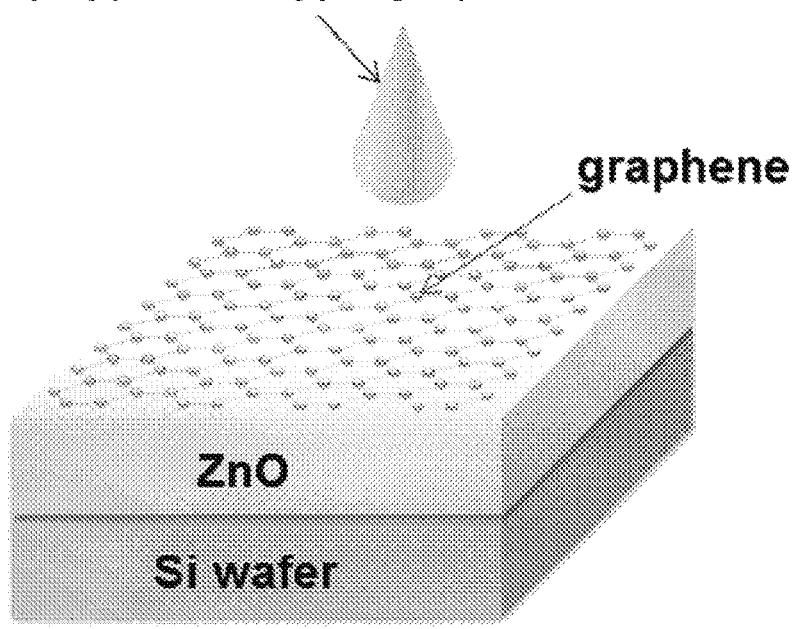
FIG. 3 is a view illustrating a process of doping graphene with a p-type or n-type impurity according to an exemplary embodiment of the present invention.

In order to solve the limitations, according to an exemplary embodiment of the present invention, a light emitting device including: an electrode layer contacting an upper portion of a light emitting diode (LED) and a layer formed of pristine or doped graphene on the electrode layer, may be provided.

In order to solve the limitations, according to another exemplary embodiment of the present invention, a method for fabricating a light emitting device using pristine graphene or doped graphene, the method including: depositing a first electrode as a thin film, on the light emitting device; transferring pristine graphene or doped graphene on the first electrode thin film; etching the light emitting device in contact with the first electrode thin film on which the graphene is transferred to thereby remove a portion of the electrode thereon; spin-coating photoresist on the etched light emitting device; removing the photoresist from the spin-coated light emitting device to thereby form a circular electrode thin film as well as pristine or doped graphene transferred on the electrode film; and depositing a metal on a lower electrode, a second electrode, may be provided.

The light emitting device doped with graphene may be fabricated by further including exposing a portion of the first electrode thin film by removing a portion of graphene through a photolithography process; and depositing a metal on a lower electrode, a second electrode, in the method for fabricating a light emitting device using pristine graphene or doped graphene.

The light emitting device according to an exemplary embodiment of the present invention may be a light emitting diode (LED) and may include an n-GaN layer and a p-GaN layer, and a multi-quantum well layer interposed therebetween. A first electrode layer may come into contact with the upper portion of the LED. The first electrode layer corresponds to a thin film on which graphene may be transferred and generally includes all types of thin film able to be used as a transparent electrode through which light is emitted. Thin films capable of bringing about graphene Plasmon effects to exhibit light amplification effects correspond to the types of thin film and preferably, a zinc oxide metal may be used as a transparent electrode layer. More preferably, the light amplification effects may be further increased by doping Ga into the zinc oxide metal.

In an exemplary embodiment, the first electrode layer may be formed using various formation methods such as a sputtering method, an electroplating method, an E-beam evaporator method, a thermal evaporation forming method, and the like. In an exemplary embodiment of the present invention, a zinc oxide layer is deposited on p-GaN using the sputtering method.

In an exemplary embodiment of the present invention, the LED device may include a general LED device and more particularly, may include the first electrode layer serving as a p-type electrode, a p-type gallium nitride layer formed on a lower surface of the p-type electrode, an active layer formed on a lower surface of the p-type gallium nitride layer, an n-type gallium nitride layer formed on a lower surface of the active layer, a metal layer serving as a second electrode formed on an upper surface of an exposure portion exposed from the n-type gallium nitride layer, and pristine graphene or doped graphene on an upper surface of the first electrode layer serving as the p-type electrode. In addition, a portion of the graphene may be etched using a photolithography method to partially expose the first electrode layer.

Photolithography is to develop a pattern by for example, a method of thinly forming photosensitive photoresist on a surface of a substrate or a semiconductor and then, installing a desired mask pattern thereon and applying light thereto to thereby take an exposure picture.

In an exemplary embodiment, a zinc oxide layer doped with gallium is attached to an upper portion of an LED, graphene is transferred on the layer and then, doping and annealing are performed thereon, etching is performed to partially etch the graphene, and photoresist is thinly formed and then, is etched using oxygen plasma and inductively coupled plasma (ICP) to thereby form a pattern.

In an exemplary embodiment, the active layer, a layer generating and emitting light, may be generally formed of a multi-quantum well structure having InGaN-well layers and GaN-barrier layers. The active layer may be configured of a single quantum well layer or may be configured to have a double heterostructure in which quantum well layers are narrowed in p-type and n-type materials having high band gap energy.

In an exemplary embodiment, a removal process of the gallium nitride layer other than a device region may be performed using an etching process, such that the gallium nitride layer may be removed to expose a partial region.

Since zinc oxide has a wide direct band gap of 3.37 eV, it has superior transmittance in regions of visible light and infrared light and preferably, is used as a transparent electrode layer. However, a thin film usable as an electrode is not necessarily limited to the zinc oxide and may include all types of thin film usable as a transparent electrode layer but the types of thin film should have light amplification effects of graphene.

The Plasmon effects may have relevance to density of charge carriers (electrons or holes). Accordingly, light efficiency may be increased by adjusting the density of charge carriers. The adjustment of charge carriers in graphene may be conducted by doping or injecting an n-type or p-type impurity into graphene, using an ion implantation method or a chemical method.

In an exemplary embodiment of the present invention, n-type graphene is graphene doped with an n-type impurity and here, the n-type impurity may contain at least one element selected from the group consisting of nitrogen (N), fluorine (F), and manganese (Mn) and may be selected from ammonia, benzyl viologen (BV) or mixtures thereof.

In an exemplary embodiment of the present invention, light emission efficiency may be varied depending on a concentration of an impurity doped in the n-type graphene. The light emission efficiency is not linearly increased in accordance with an increase in the amount of the doped impurity. It is preferable to perform doping with a concentration of an n-type impurity ranging from 1 to 50 mM. More preferably, the concentration of the n-type impurity implementing light emission efficiency may range from 3 to 15 mM.

In an exemplary embodiment of the present invention, p-type graphene is graphene doped with a p-type impurity and here, the p-type impurity may contain at least one element selected from the group consisting of oxygen (O), gold (Au), and bismuth (Bi) and may be selected from at least one compound among the group consisting of $CH_3NO_2$, $HNO_3$, $HAuCl_4$, $H_2SO_4$, HCl, and $AuCl_3$, or mixtures thereof.

In an exemplary embodiment of the present invention, light emission efficiency may be varied depending on a concentration of an impurity doped in the p-type graphene. Similarly to the case of the n-type graphene, it is preferable to perform doping with a concentration of a p-type impurity ranging from 1 to 50 mM. More preferably, the concentration of the p-type impurity implementing light emission efficiency may range from 3 to 15 mM.

Specifically, after an electrode layer such as a zinc oxide layer is attached to an upper portion of the light emitting device and then, graphene is transferred thereon, the graphene is doped by the adsorption of a compound and annealing. The annealing may be performed at a temperature of 700° C. to 1200° C. for 1 minute to 10 minutes and more preferably, may be performed at a temperature of 800° C. to 1000° C. for 2 minutes to 5 minutes.

In this case, the graphene may be pristine graphene containing no impurity added therein, or may be graphene containing an n-type impurity or a p-type impurity. The form of the graphene may include both of a single-layer graphene and a multilayer graphene. More preferably, a single-layer graphene may be used. The n-type impurity or p-type impurity may be maintained for predetermined time while a doping solution containing the impurity is applied. During time in which the doping solution containing the n-type impurity or p-type impurity is applied, since a portion of the doping solution may be adsorbed onto the pristine graphene, the amount of the doping solution adsorbed onto the graphene may be increased in accordance with the extension of adsorption time. Thus, the amount of the n-type impurity or p-type impurity adsorbed onto the pristine graphene for controlling such a concentration may be adjusted by varying the concentration of the impurity or a doping time thereof.

The light emitting device on which pristine graphene or doped graphene is transferred may be etched under oxygen plasma and ICP conditions and may be subjected to a photolithography process through photoresist spin-coating. A region other than a portion protected by the spin-coated photoresist on an upper portion of a zinc oxide electrode layer on which the pristine graphene or doped graphene is transferred may be etched, and only a spin shaped, cylindrical zinc oxide electrode may remain. The cylindrical zinc oxide on which the pristine graphene or doped graphene is transferred may be utilized as a transparent electrode layer; however, it is merely provided as an example of an exemplary embodiment of the present invention. The photolithography is performed without the spin-coating to allow the pristine graphene or doped graphene to be transferred on the electrode layer, thereby fabricating an LED in a state in which an electrode layer structure is maintained.

As an example of an exemplary embodiment of the present invention, in a removal process of a photoresist pattern, the photoresist pattern on the surface of the substrate may be removed using acetone or photoresist (PR) striper, such that nanomaterials in a region on which the photoresist pattern is present may be removed.

1. FABRICATING EXAMPLE 1: FABRICATING OF GRAPHENE/ZINC OXIDE THIN FILM SAMPLE

After fabricating a zinc oxide (ZnO) thin film on a silicon substrate, graphene fabricated using chemical vapor deposition (CVD) was transferred on the film. The zinc oxide (ZnO) thin film was deposited using a high frequency sputtering method. After the deposition was terminated, thermal treatment was performed on the film at a temperature of 900° C. for 5 minutes in order to enhance crystallinity of zinc oxide, such that a graphene/zinc oxide thin film sample was fabricated.

2. EXPERIMENTAL EXAMPLE 1: RAMAN SPECTRUM OF FABRICATING EXAMPLE 1

Figure 4:
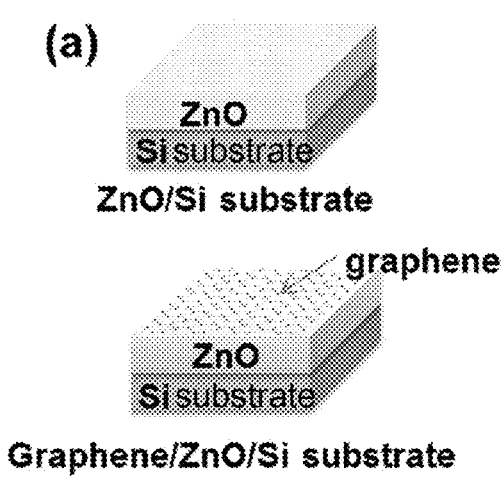
FIG. 4 shows Raman spectrum data of zinc oxide electrode films depending on whether or not graphene is present, according to an exemplary embodiment of the present invention.
Figure 4:
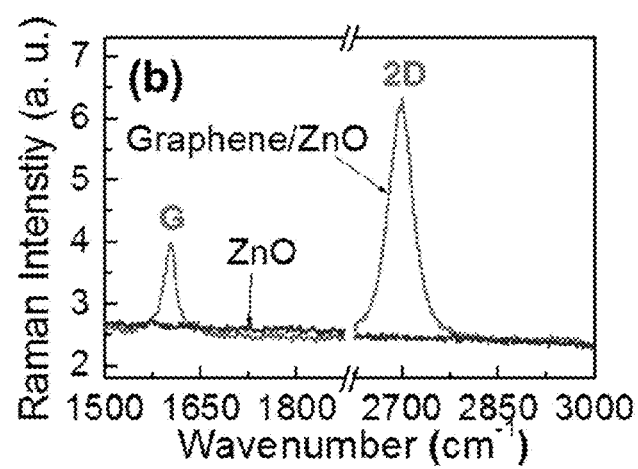

Raman spectrum results of silicon on which the graphene/zinc oxide thin film sample was deposited were confirmed. Panel (a) of FIG. 4 shows comparison between a zinc oxide/silicon substrate on which graphene was not transferred and a zinc oxide/silicon substrate on which graphene was transferred, and Panel (b) of FIG. 4 shows results of the comparison. In the zinc oxide/silicon substrate on which graphene was transferred, peak G in the vicinity of 1590 cm-1 and peak 2D in the vicinity of 2700 cm-1 were indicated as Raman peaks. On the other hand, in the zinc oxide/silicon substrate on which graphene was not transferred, any signal was not confirmed at the two positions.

In the peaks G and 2D, a Raman intensity ratio of the peaks was indicated as about 0.4 and it could be confirmed that the deposited graphene is a single-layer graphene.

3. EXPERIMENTAL EXAMPLE 2: LIGHT AMPLIFICATION PHENOMENON OF FABRICATING EXAMPLE 1

Figure 5:
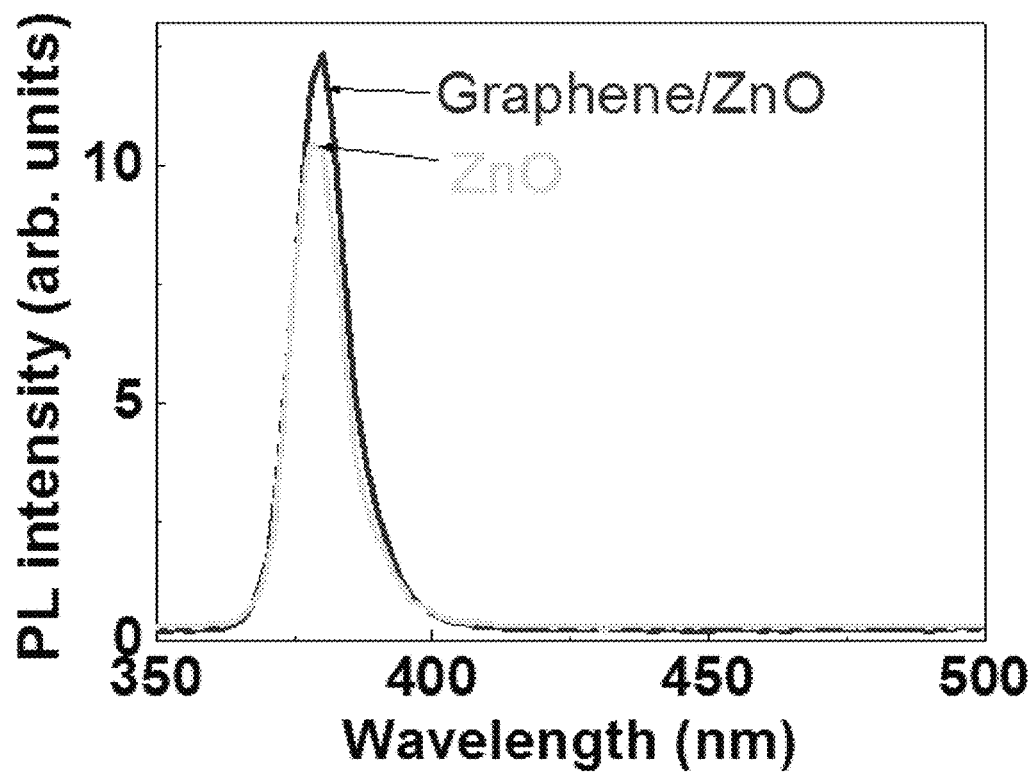
FIG. 5 is a graph showing photoluminescence (PL) intensities of the zinc oxide electrode films depending on whether or not graphene is present, according to an exemplary embodiment of the present invention.

In order to confirm a light amplification degree of zinc oxide on which graphene is transferred, photoluminescence (PL) intensities and wavelengths showing the highest PL intensities were confirmed with regard to the zinc oxide thin film on which graphene is not transferred and the zinc oxide thin film on which graphene is transferred. As an experimental result, it could be confirmed that PL intensity was increased by 20% or more in the zinc oxide thin film on which graphene is transferred, as compared to the zinc oxide thin film on which graphene is not transferred (FIG. 5). In the case of wavelengths in which the PL intensities were highest, locations of peaks thereof were identical to each other, regardless of whether or not graphene was transferred. It could be confirmed that, through the transfer of graphene, only the magnitude of PL was enhanced without the movement of PL wavelengths.

Figure 6:
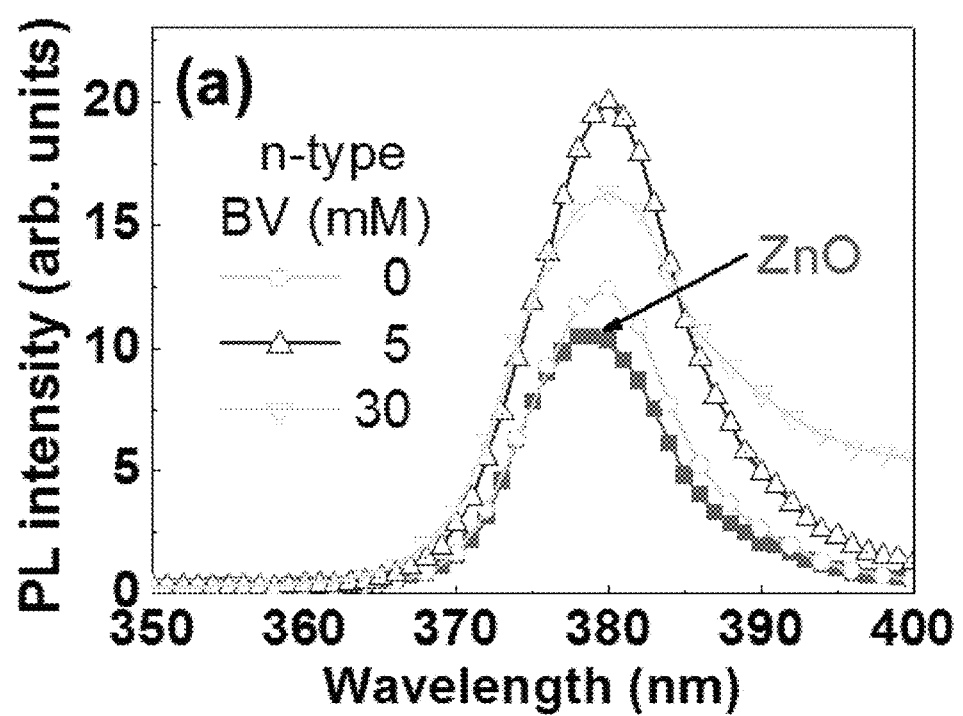
FIG. 6 is a graph showing PL intensities of a zinc oxide electrode film on which graphene is not transferred, and a zinc oxide electrode film on which n-type graphene is transferred depending on a BV concentration, according to an exemplary embodiment of the present invention.

4. EXPERIMENTAL EXAMPLE 3: LIGHT AMPLIFICATION PHENOMENON AND TRANSMITTANCE OF DOPED N-TYPE GRAPHENE (1) Light Amplification Phenomenon of N-Type Graphene N-type graphene was fabricated by doping pristine graphene with 0 mM, 5 mM and 30 mM of benzyl viologen (BV), differently. A photoluminescence (PL) spectrum of pristine graphene or n-type graphene/zinc oxide is illustrated. As can be seen in FIG. 6, a PL enhancement ratio was not proportional to a BV concentration and was the highest in the zinc oxide doped with 5 mM of BV. Further, it could be confirmed that as a result of testing the PL enhancement ratio after treating the concentration of 30 mM, the PL enhancement ratio was decreased. However, it could be confirmed that independently of the occurrence of a difference in PL intensities, wavelengths of PL peaks were not changed.

(2) Light Amplification Phenomenon of P-Type Graphene

Figure 7:
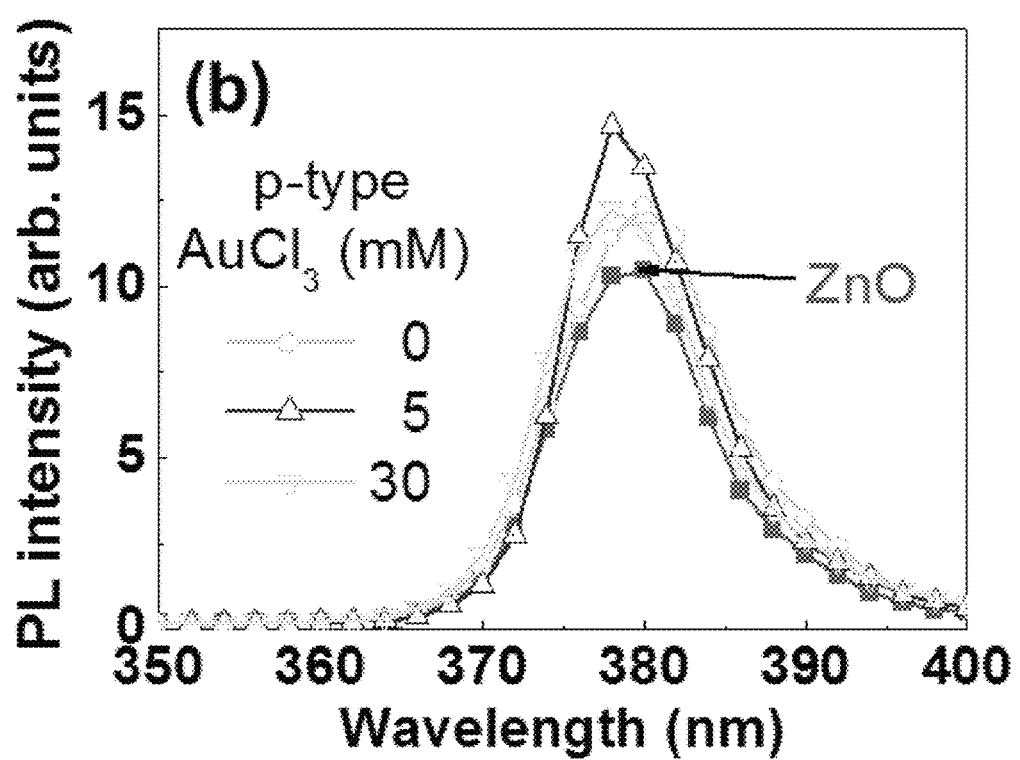
FIG. 7 is a graph showing PL intensities of a zinc oxide electrode film on which graphene is not transferred, and a zinc oxide electrode film on which p-type graphene is transferred depending on an $AuCl_3$ concentration, according to an exemplary embodiment of the present invention.

P-type graphene was fabricated by doping pristine graphene with 0 mM, 5 mM and 30 mM of $AuCl_3$, differently. A photoluminescence (PL) spectrum of pristine graphene or p-type graphene/zinc oxide is illustrated. As can be seen in FIG. 7, a PL enhancement ratio was not proportional to an $AuCl_3$ concentration and was the highest in the zinc oxide doped with 5 mM of $AuCl_3$. Further, it could be confirmed that as a result of testing the PL enhancement ratio after treating the concentration of 30 mM, the PL enhancement ratio was decreased. Similarly to Experimental Example 3, it could be confirmed that independently of the concentration, wavelengths of PL peaks were not changed.

(3) Light Amplification Phenomenon in N-type Graphene and P-Type Graphene

Figure 8:
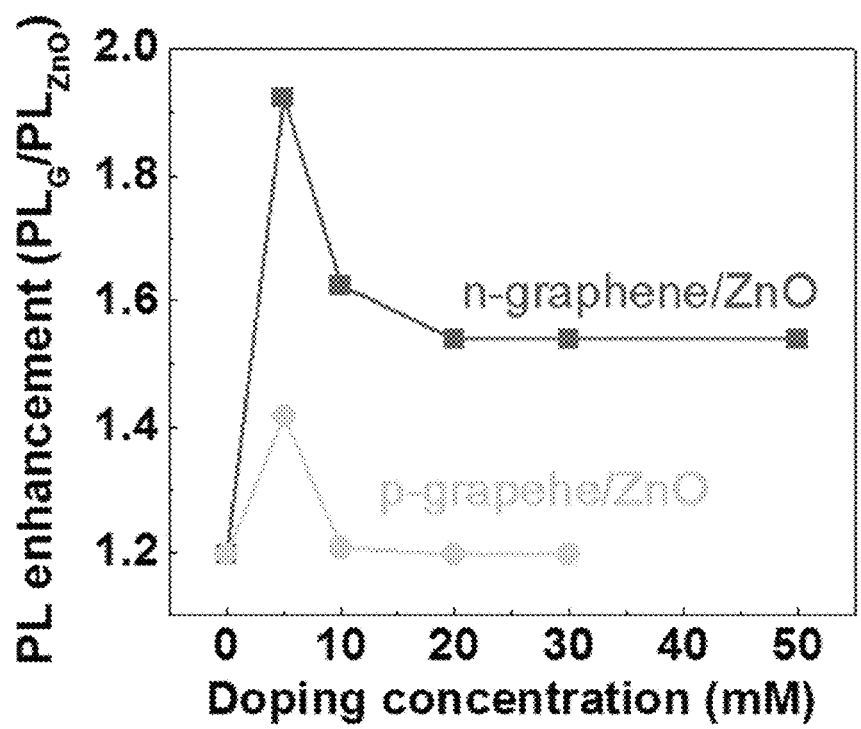
FIG. 8 is a graph showing PL enhancements of zinc oxide electrode films on which graphene is transferred depending on a concentration of an impurity doped into n-type graphene and p-type graphene, according to an exemplary embodiment of the present invention.

As to all samples having pristine graphene, n-type graphene and p-type graphene, PL intensities of graphene/zinc oxide were increased by at least 20% or more, as compared to PL intensities in the zinc oxide thin film in which graphene is not present. In addition, it could be confirmed that the magnitude of PL was varied in accordance with a change in doping concentration and in a doping concentration of 5 Mm, a ratio of increase in PL was the highest and about 80% of light amplification effects were shown (FIG. 8).

Figure 9:
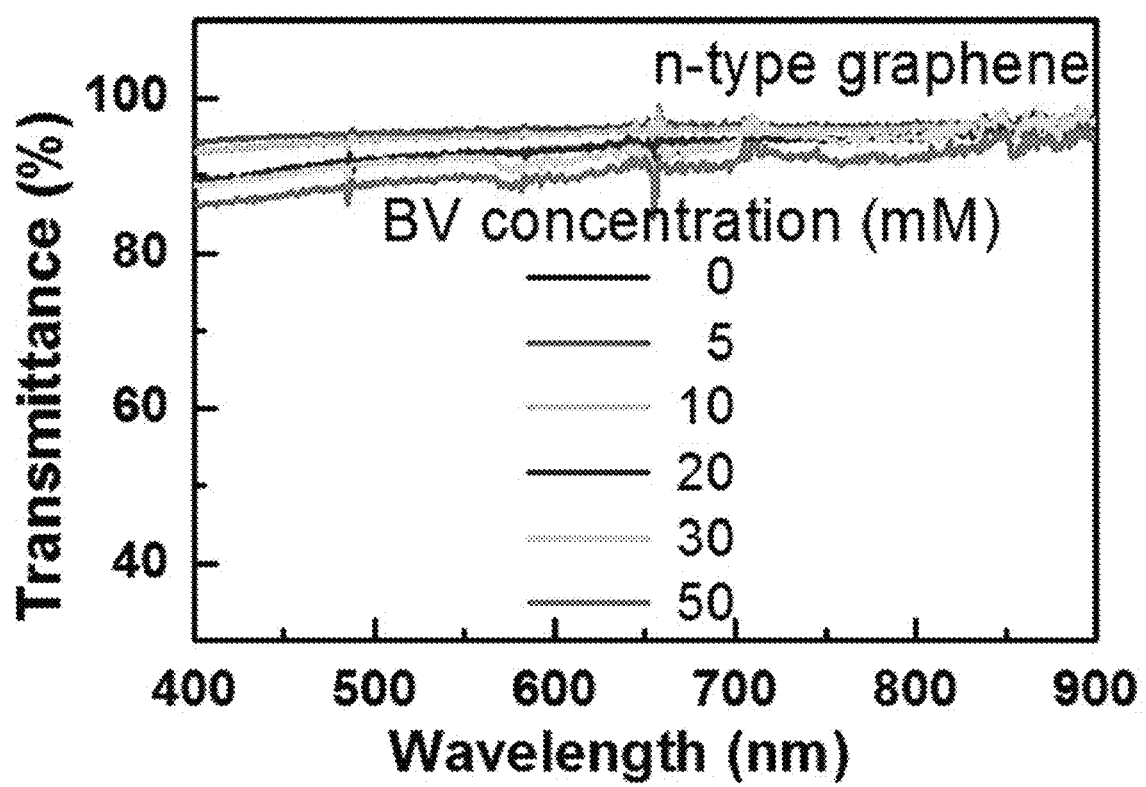
FIG. 9 is a graph showing a transmittance of light with respect to the amount of an impurity doped into n-type graphene, according to an exemplary embodiment of the present invention.
Figure 10:
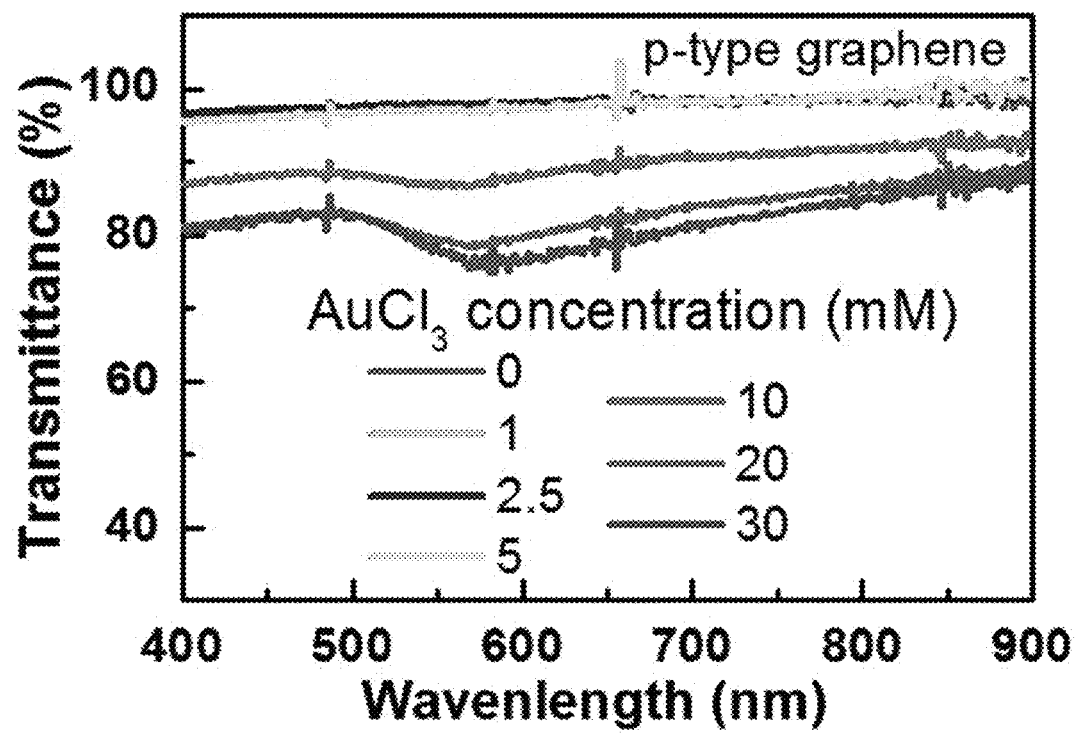
FIG. 10 is a graph showing a transmittance of light with respect to the amount of an impurity doped into p-type graphene, according to an exemplary embodiment of the present invention.

(4) Experimentation of Transmittance in Graphene According to Doping Concentration As can be seen in FIG. 9 and FIG. 10, transmittances of light in the n-type graphene doped with BV and the p-type graphene doped with $AuCl_3$ according to an increase in doping concentration were measured. In general, a transmittance of ideal graphene in a visible ray region was about 97.2%, and transmittances of light in both the n-type graphene and the p-type graphene tended to decrease according to the doping concentration. However, it could be confirmed that when the doping concentration was equal to or less than 10 mM, all transmittances were 90% or more

Figure 11:
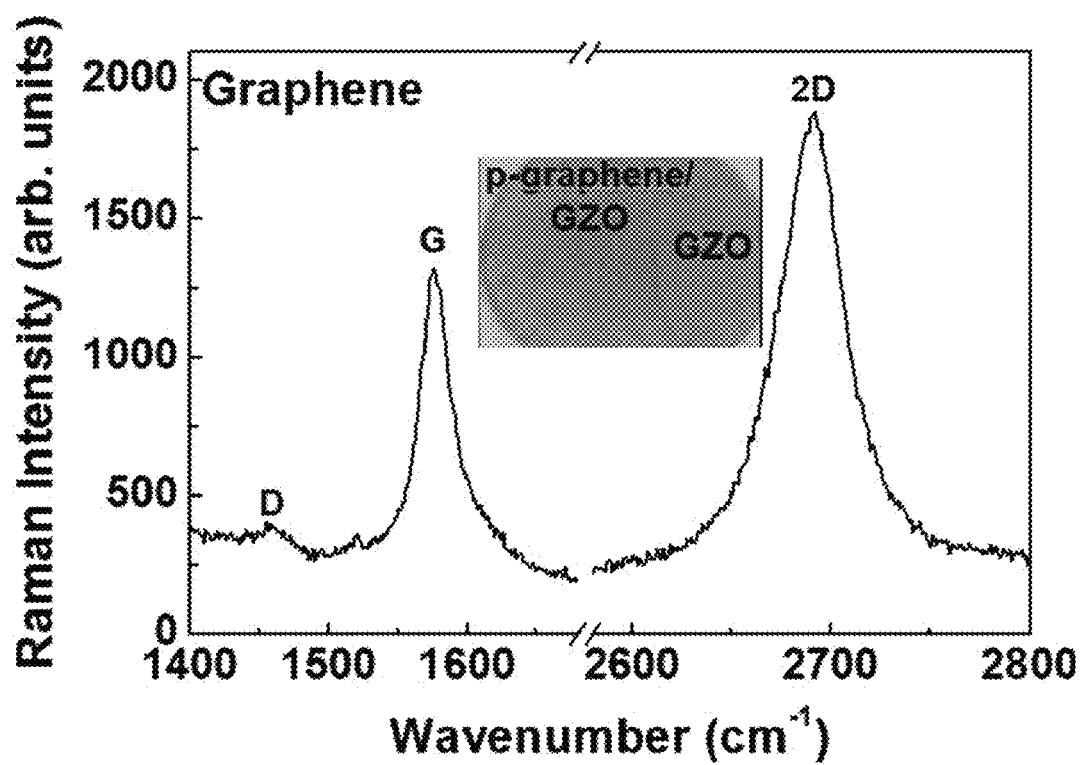
FIG. 11 shows Raman spectrum data of a p-type graphene/Ga-doped zinc oxide structure according to an exemplary embodiment of the present invention.
Figure 12:
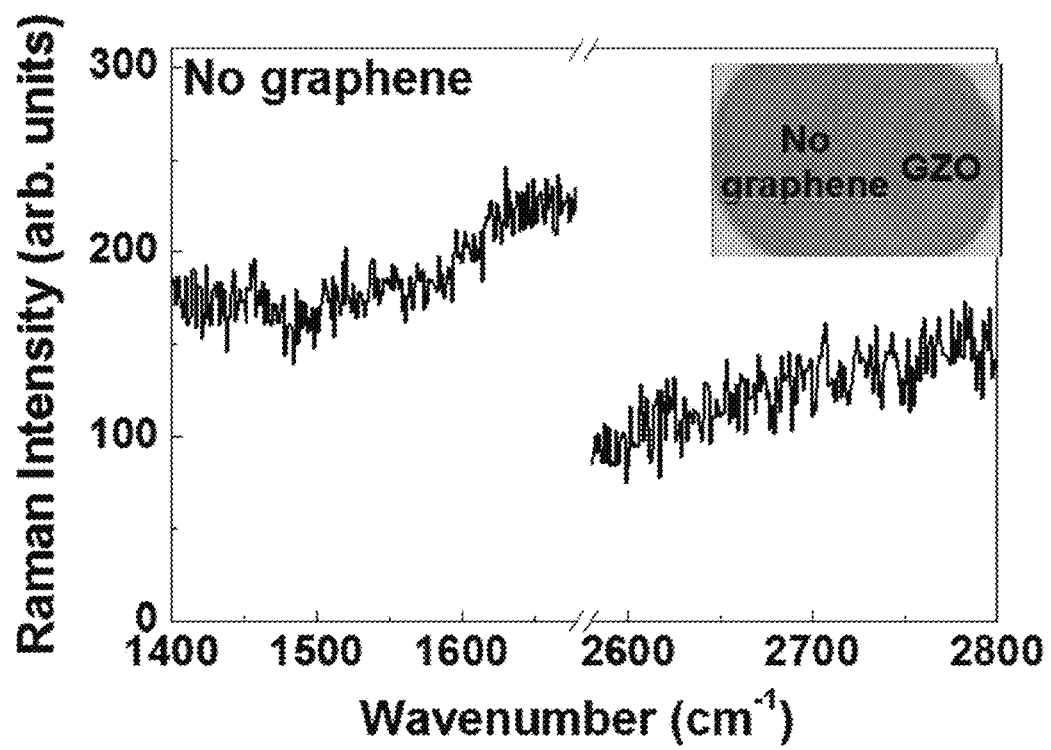
FIG. 12 shows Raman spectrum data of Ga-doped zinc oxide without graphene according to an exemplary embodiment of the present invention.

5. EXPERIMENTAL EXAMPLE 4: ANALYSIS OF PROPERTIES OF LIGHT EMITTING DEVICE IN THE PRESENCE OF GRAPHENE (1) Analysis of Raman Spectrum Depending on Whether or Not Graphene was Present FIG. 11 and FIG. 12 show Raman spectrum results in an upper electrode in which the execution of an LED process has been terminated. In order to increase electrical conductivity of a zinc oxide thin film used as a transparent electrode, the zinc oxide thin film was doped with 2 mole % of gallium (Ga) to enhance the electrical conductivity. An optical microscope image and a Raman spectrum image of zinc oxide doped with Ga in the case that graphene was present and in the case that graphene is not present are shown. As an analysis result, it could be confirmed from FIG. 11 that a clear spectrum exhibited in the presence of graphene was shown in portions D, G, and 2D of the p-type graphene. On the other hand, it could be confirmed from FIG. 12 that distinctive peaks were not shown and spectrum intensity was irregularly shown in the case that graphene is not present.

Figure 13:
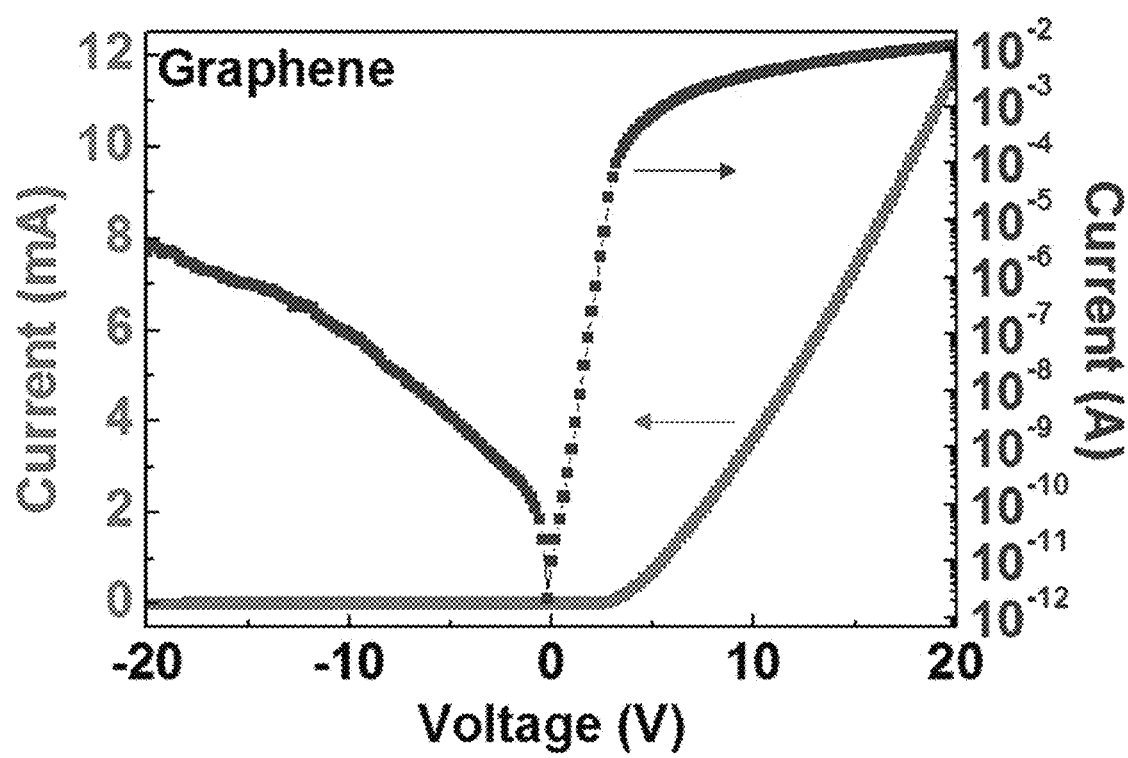
FIG. 13 is a current-voltage curve of a GaN light emitting diode (LED) using a p-type graphene/Ga-doped zinc oxide electrode, according to an exemplary embodiment of the present invention.
Figure 14:
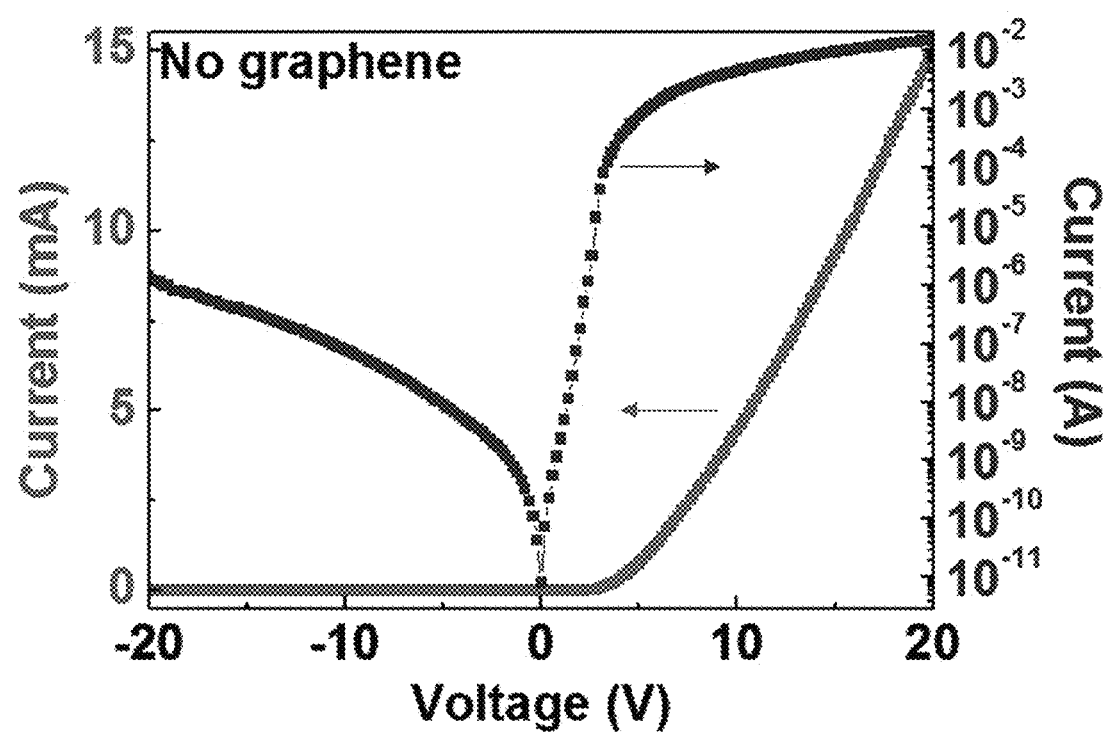
FIG. 14 is a current-voltage curve of a GaN light emitting diode (LED) using a Ga-doped zinc oxide electrode without graphene, according to an exemplary embodiment of the present invention.

(2) Comparison of Current-Voltage Curve of Light Emitting Device in the Presence of Graphene FIG. 13 and FIG. 14 show comparative views of current-voltage curves in the case that graphene is present on a zinc oxide electrode doped with Ga and in the case that graphene is not present on the zinc oxide electrode doped with Ga. In both FIG. 13 in which graphene is present on the zinc oxide and FIG. 14 in which graphene is not present on the zinc oxide, commutating curves which are diode characteristics were observed in two devices, regardless of whether or not graphene is present. Through this, it could be confirmed that electrical characteristics of the light emitting device were not degraded by graphene itself.

(3) Comparison of Electroluminescence (EL) Spectrum in the Presence of Graphene

Figure 15:
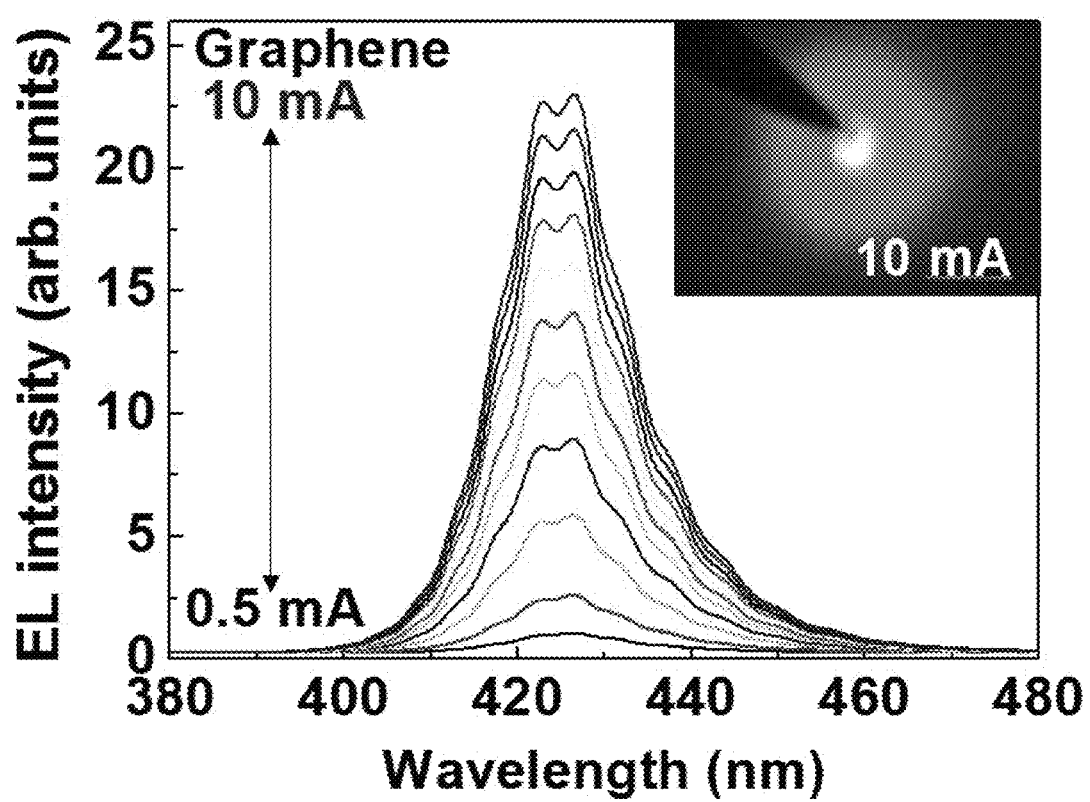
FIG. 15 is an electroluminescence (EL) spectrum of a GaN light emitting diode (LED) using a p-type graphene/Ga-doped zinc oxide electrode, according to an exemplary embodiment of the present invention.
Figure 16:
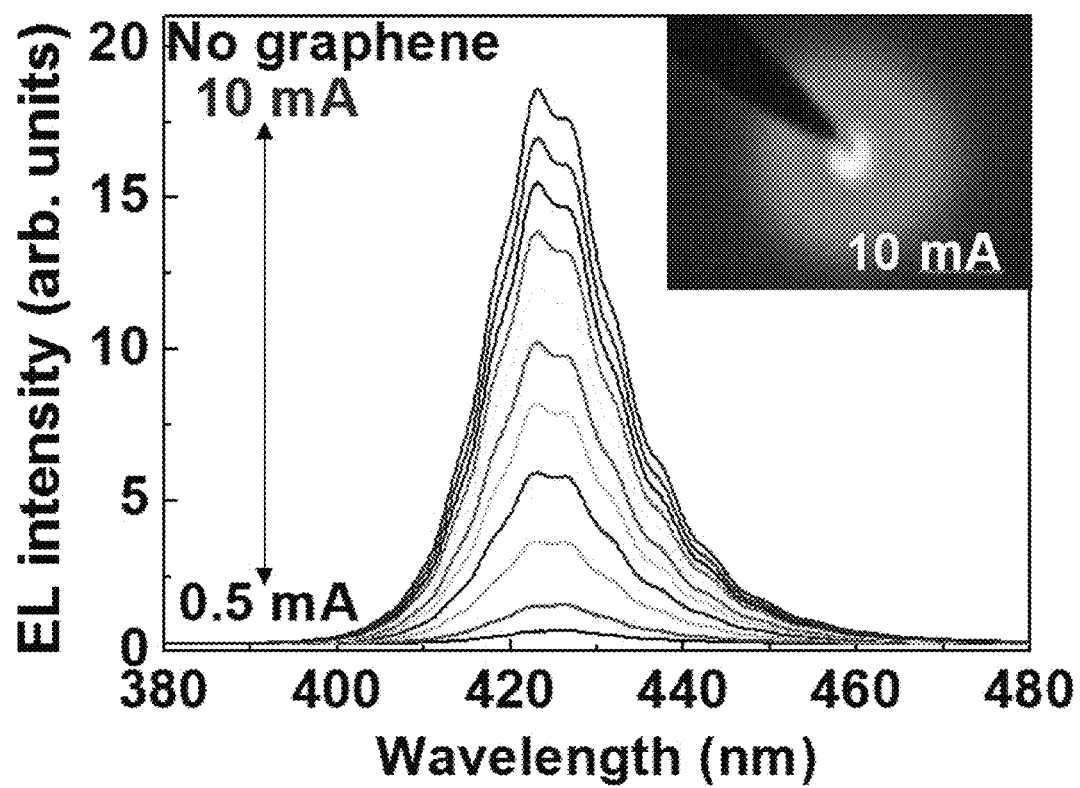
FIG. 16 is an EL spectrum of a GaN light emitting diode (LED) using a Ga-doped zinc oxide electrode without graphene, according to an exemplary embodiment of the present invention.

FIG. 15 and FIG. 16 show EL spectra of a light emitting device having graphene on an electrode and a light emitting device having no graphene on the electrode. In both the light emitting device having graphene (FIG. 15) and the light emitting device having no graphene (FIG. 16), it could be confirmed that EL peaks were shown at a wavelength of 425 nm. Through this, it could be confirmed that a wavelength showing the EL peaks was not affected, regardless of whether or not the graphene is present and independently of an injection current.

While the present invention has been shown and described in connection with the embodiments of the present invention, it will be apparent to those skilled in the art that the present invention may be embodied in other concrete forms without changing technical ideas or essential characteristics thereof. Therefore, the disclosed embodiments of the invention are provided by way of example and are not for purposes of limitation.

(4) EL Intensity Depending on Injection Current

Figure 17:
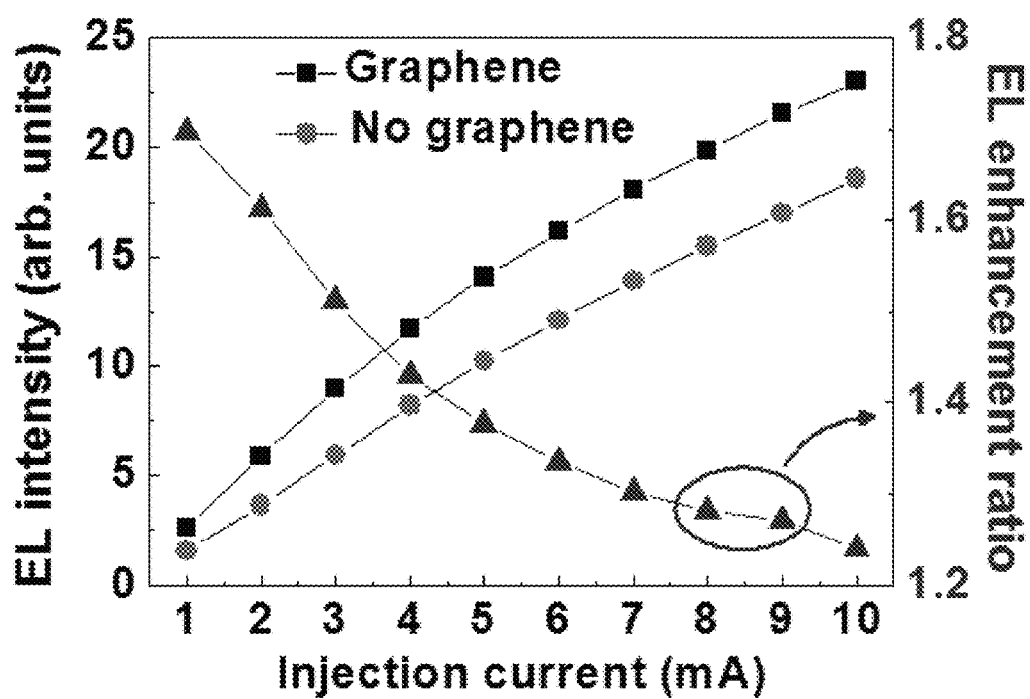
FIG. 17 is a diagram illustrating results obtained by averaging EL intensities and EL enhancement ratios of thirty GaN light emitting diodes depending on intensities of current applied to GaN light emitting diodes in the case that p-type graphene is present on a Ga-doped zinc oxide electrode and in the case that p-type graphene is not present on a Ga-doped zinc oxide electrode.

Thirty devices were fabricated using zinc oxide doped with gallium as a transparent electrode. EL intensities generated by varying intensities of a current (1 to 10 mA) injected to the corresponding devices were measured, and average values of the EL intensities are shown in FIG. 17. The EL intensities were linearly increased in accordance with an increase in the intensity of the injection current, and a light emission intensity of a light emitting device on which graphene was transferred was measured to be greater than that of a light emitting device having no graphene. It could be confirmed that an EL enhancement ratio due to graphene was increased, and enhancement was approximately at least 1.2 times to at most 1.8.

What is claimed is:

1. A method for fabricating a light emitting device of a graphene/zinc oxide electrode, the method comprising:
    forming a first electrode thin film composed of Zinc Oxide doped with Ga on an upper surface of a p-type semiconductor layer of a light emitting diode in which an active layer is interposed between the p-type semiconductor layer and an n-type semiconductor layer;
    transferring an n-type graphene having an concentration of an n-type impurity contained in the n-type graphene from 1 mM to 5 mM on the first electrode thin film;
    exposing a portion of the n-type semiconductor layer by etching the n-type graphene, the first electrode thin film, and a part of the light emitting diode, thereby forming an etched area and a non-etched area;
    spin-coating a photoresist on the etched area and the non-etched area;
    removing the photoresist from the etched area and the non-etched area, and forming a circularly-shaped first electrode thin film from the n-type graphene on the non-etched area; and
    forming a second electrode on the etched area by depositing a metal on the n-type semiconductor layer, wherein the n-type graphene increases a light emission efficiency of the light emitting device by a plasmon effect of the n-type graphene.

2. The method of claim 1, further comprising: exposing a portion of the first electrode thin film by removing a portion of the n-type graphene through a photolithography process, prior to the depositing of the metal on the n-type semiconductor layer.

3. The method of claim 1, wherein the metal on the n-type semiconductor layer is gold.

4. The method of claim 1, wherein the n-type graphene contains at least one element selected from a group consisting of nitrogen (N), fluorine (F), and manganese (Mn), or contains ammonia, benzyl viologen (BV) or mixtures thereof.

5. The method of claim 1, wherein the n-type graphene is formed through doping and annealing under a nitrogen atmosphere.

6. The method of claim 5, wherein the annealing is performed at a temperature of 700° C. to 1200° C. for 3 minutes to 10 minutes.

* * * * *